United States Patent [19]

Furman

[11] Patent Number: 4,882,505

[45] Date of Patent: Nov. 21, 1989

[54] FULLY SYNCHRONOUS HALF-FREQUENCY CLOCK GENERATOR

[75] Inventor: Anatol Furman, Jericho, Vt.

[73] Assignee: International Business Machines Corporation, Armonk, N.Y.

[21] Appl. No.: 843,348

[22] Filed: Mar. 24, 1986

[51] Int. Cl.$^4$ .................. H03K 5/15; H03K 23/44
[52] U.S. Cl. .................. 307/269; 377/105; 377/107; 377/111; 377/121; 377/122; 377/79
[58] Field of Search .................. 377/105, 77, 79, 67, 377/107, 111, 121, 122; 307/269

[56] References Cited

U.S. PATENT DOCUMENTS

| | | | |
|---|---|---|---|
| 3,290,606 | 12/1966 | Rodner | 307/269 |
| 3,322,974 | 5/1967 | Ahrons | 307/279 |
| 3,428,913 | 2/1969 | Pechoucek | 377/76 |
| 3,657,557 | 4/1972 | Smith et al. | 377/105 |
| 3,683,415 | 8/1972 | Lloyd et al. | 370/100 |
| 3,704,452 | 11/1972 | Beausoleil et al. | 377/79 |
| 3,720,841 | 3/1973 | Suzuki | 377/79 |
| 3,745,371 | 7/1973 | Suzuki | 377/79 |
| 3,766,408 | 10/1973 | Suzuki et al. | 377/74 |
| 3,829,713 | 8/1974 | Canning | 377/105 |
| 3,838,293 | 9/1974 | Shah | 377/79 |
| 3,930,169 | 12/1975 | Kuhn | 377/28 |
| 3,946,255 | 3/1976 | Stein | 307/269 |
| 4,002,926 | 1/1977 | Moyer | 377/107 |
| 4,236,121 | 11/1980 | Senturia | 307/446 |
| 4,250,406 | 2/1981 | Alaspa | 307/279 |
| 4,316,158 | 2/1982 | Akita et al. | 331/111 |
| 4,542,301 | 9/1985 | Narabu | 377/79 |

FOREIGN PATENT DOCUMENTS 2269238 11/1975 France .
52-67559 4/1977 Japan .................. 377/107

OTHER PUBLICATIONS

IBM Tech Disclosure Bul., vol. 25, No. 11A, Apr. 1985, pp. 5613–5620, "Phase Selector & Synchronizer for Two Phase Clock Circuits" by Cannon et al.
Pulse, Digital & Switching Waveforms by Millman & Taub, pp. 349–352, copyright 1965.
"Two Phase Dynamic Frequency Divider" by R. Glaise, IBM Technical Disclosure Bulletin, vol. 17, No. 6, Nov. 1974, pp. 1642–1643.
"Complementary FET Dynamic Shift Register Using a Single Phase Line" by F. H. Gaensslen et al, pp. 2144 and 2145 of IBM Technical Disclosure Bulletin, vol. 12, No. 12, May, 1970.

Primary Examiner—John S. Heyman
Attorney, Agent, or Firm—Sughrue, Mion, Zinn, Macpeak & Seas

[57] ABSTRACT

A clock generating circuit having at least one loop of at least two stages. Each stage consists of a pass transistor serially connected to an inverter. An inverter couples the end of the loop to its beginning. The gate electrodes of the transistors in the serially connected stages are controlled alternatively by a true and a complemented clock signal. Preferably, there are two such loops operating in parallel but which include initialization circuitry that initializes the two loops to complementary values.

7 Claims, 4 Drawing Sheets

FULLY SYNCHRONOUS HALF-FREQUENCY CLOCK GENERATOR

BACKGROUND

1. Field of the Invention

The invention relates generally to timing circuits. In particular, the invention relates to the generation of multiple timing signals that have a resolution of twice the frequency of a clock oscillator driving the circuit.

2. Background Art

In computer systems and other relatively complex electronic circuits the need often exists for the generation of complex timing signals. A clock circuit, such as a quartz crystal oscillator, produces a binary clock signal with a period of $T_c$. Although the clock signal itself is sufficient for timing control in relatively simple circuits in more complex circuits the clock signal is converted into several timing signals that have different forms but have a fixed phase relation to each other.

An example of such a clock generator well known in the prior art, for generating a two-phase clock is illustrated in FIG. 1. A ring is constructed of first through fourth master-slave flip-flops 10, 12, 14, 16. The output of the first flip-flop 10 is connected to the input of the second flip-flop 12 and also provides a timing signal A. Similarly the second flip-flop 12 inputs to the third flip-flop 14 and provides the timing signal B. and the third flip-flop 14 controls the fourth flip-flop 16 and provides the timing signal C. The fourth flip-flop 16 not only provides a timing signal D but also closes the loop by inputting to the first flip-flop 10. The waveforms for the clock signal CLK and the four timing signals A, B, C and D are shown in FIG. 2. The timing signals A, B, C and D provide the necessary timing information but in the interest of reducing the number of timing signals that need to be distributed to the system being controlled, these timing signals are combined into two two-phase clock signals PH0 and PH1. The first two-phase clock signal PH0 is produced by an R/S flip-flop 18 receiving the timing signal A on its set input S and the timing signal C on its reset input R. Similarly. the second two-phase clock signal PH1 is produced by another flip-flop 20 receiving the timing signals B and D on corresponding inputs. One of the advantages of the prior art clock generator of FIG. 1 is that the clock signal CLK does not necessarily have a square waveform that is, a 50duty cycle.

The circuit of FIG. 1 operates as a four-stage shift register containing three 0's and one 1 and is clocked by the clock signal CLK. The initialization of the loop or shift register will not be discussed here. The result is that the "1" or high signal is shifted across one of the master-slave flip-flops 10–16 once per clock period $T_c$.

One principal disadvantage of the clock generator of FIG. 1 is its speed. The resolution of both the timing signals A, B, C and D and the two-phase clock signals PH0 and PH1 is the period $T_c$ of the clock. For instance if a 10 ns resolution is required then a 100 MHz crystal oscillator is required. Although high speed crystal oscillators are available they are expensive and have stability and tolerance problems.

SUMMARY OF THE INVENTION

Accordingly, an object of this invention is to provide a clock generator that has resolution better than the period of the clock signal driving the generator.

The invention can be summarized as a clock generator, driven by a clock oscillator signal in which a multiple stage transistor shift register. with inverters between stages, has alternate transistors gated by the clock signal and intermediate transistors gated by a complement of the clock signal.

In an improvement there are two such transistor loops that are initialized such that complementary signals are produced on the two loops. Thereby. all the timing signals can be processed without the selective insertion of inverters with their attendant delay times.

DETAILED DESCRIPTION OF THE PREFERRED EMBODIMENT

The present invention relies upon the use of both true and complementary versions of the clock signal to control alternate gates. A true clock signal CT would be, for instance the output of the quartz crystal oscillator. A complementary clock signal CC is the complement of the true clock signal CT and may be produced therefrom by an inverter 21 as shown in FIG. 3.

Figure 3:
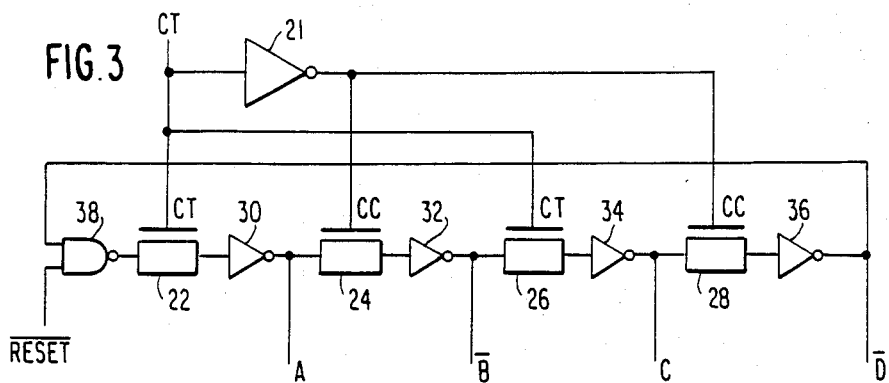
FIG. 3 is a single loop preferred embodiment of the invention.

A four-stage clock generator, built according to the invention is illustrated in FIG. 3. There are four serially connected NMOS transistors 22, 24, 26 and 28, acting as pass transistors with intervening inverters 30 32, 34 and 36. The output of the first inverter 30 is a true first timing signal A; the output of the second inverter 32. a complemented second timing signal $\overline{B}$; the output of the third inverter 34. a true third timing signal C; and the output of the fourth inverter 36, a complemented fourth timing signal $\overline{D}$. The distinction between true and complemented signals will become more apparent in the further description of further embodiments. The loop is completed by connecting the output of the fourth inverter 36 to an input of a NAND gate 38 that is connected to the input of the first transistor 22. The NAND gate 38 operates as an inverter in the loop. The gate electrodes of alternate transistors 22 and 26 are controlled by the true timing signal CT while the gates of the other transistors 24 and 28 are controlled by the complemented clock signal CC. The other input of the NAND gate 38 is connected to a negative reset signal $\overline{RESET}$ that can be used to start the circuit by its transition to a high state.

When the negative reset signal $\overline{RESET}$ is held low for more than a few clock cycles the clock generator is held in a static state irrespective of the two clock signals CT and CC. In this static, reset state the true timing signals A and C are held low and the complemented timing signals $\overline{B}$ and $\overline{D}$ are held high.

Figure 1:
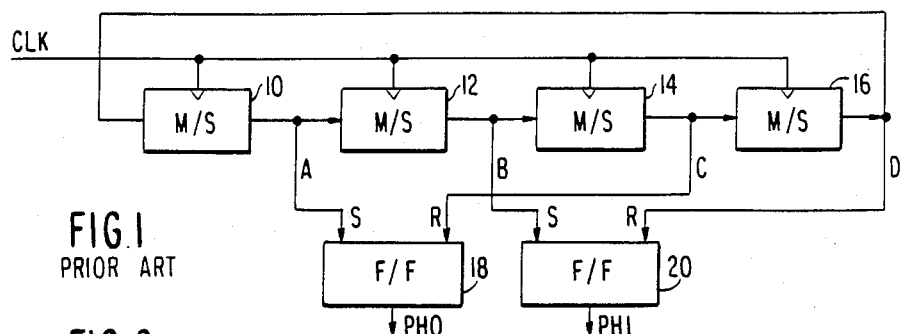
FIG. 1 is block diagram of a clock generator of the prior art.
Figure 2:
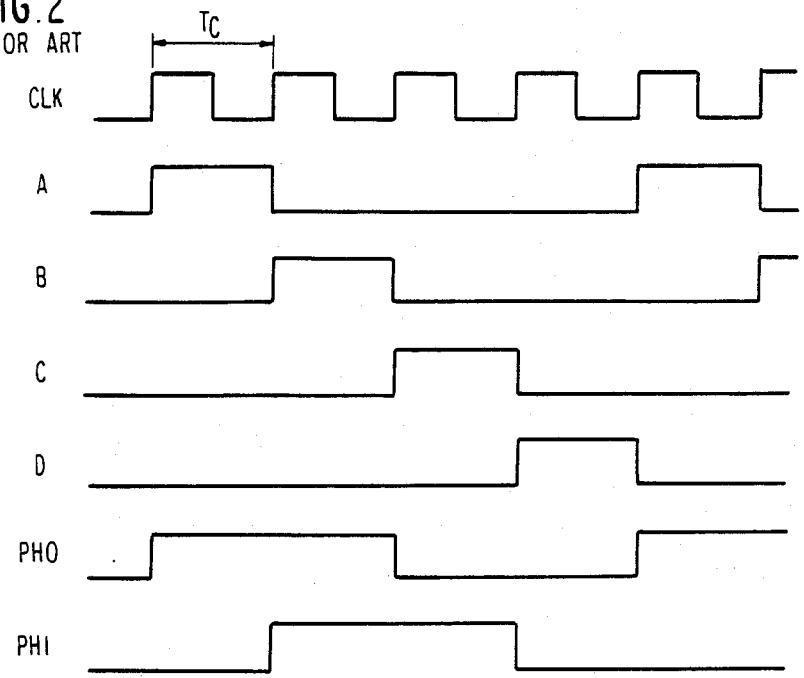
FIG. 2 is a timing diagram for the clock generator of FIG. 1.
Figure 4:
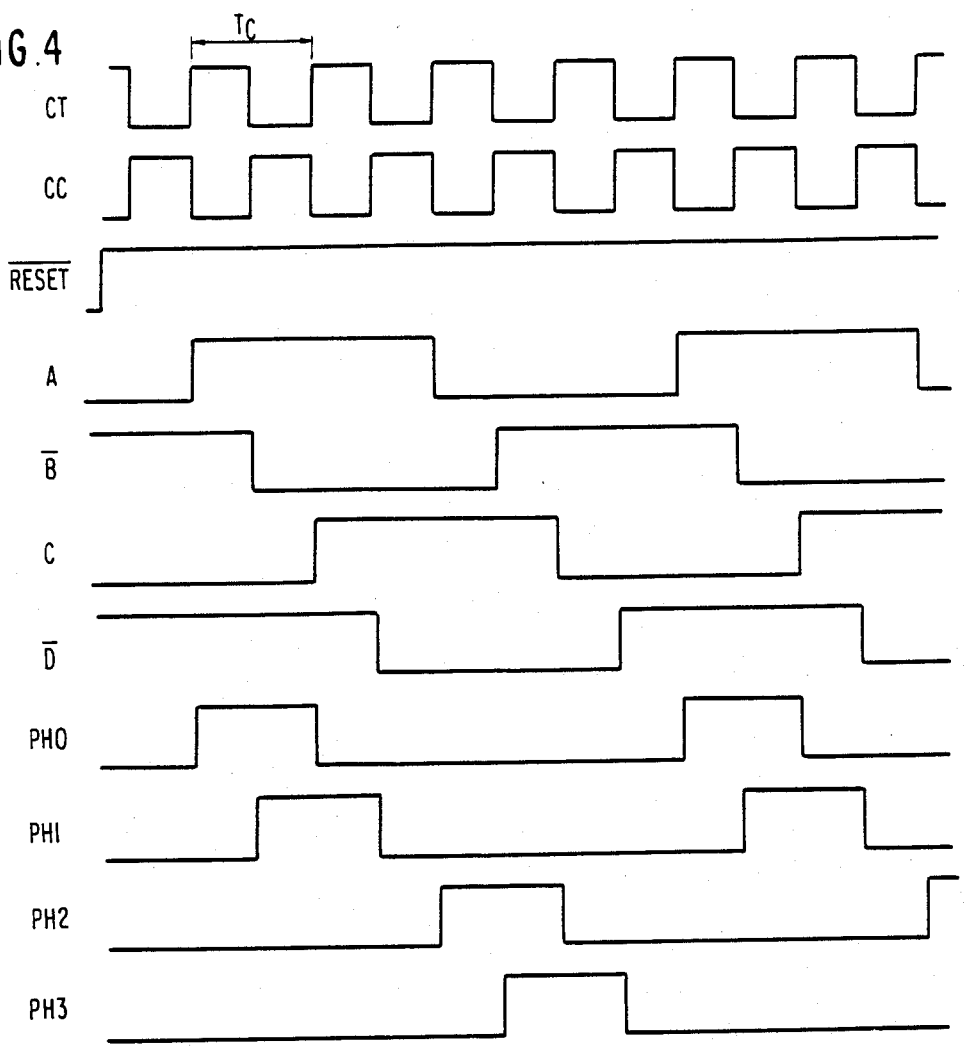
FIG. 4 is a timing diagram for the embodiment of FIG. 3.

When the negative reset signal $\overline{RESET}$ is released to a high state as shown in the timing diagram of FIG. 4, on the next upward transition of the true clock CT, the first gate 22 passes a negative signal which is inverted by the inverter 30 so as to raise the first timing signal A to a high state. On the next subsequent upward transition of the complemented clock CC corresponding to a downward transition of the true clock CT. the second flip-flop 24 passes the high value of the first timing signal A. which is then inverted by the inverter 32 to a low state for the complemented second timing signal $\overline{B}$. The important point to notice, however, is that the transitions of the two timing signals A and $\overline{B}$ are separated by one-half the clock period that is $T_c/2$, rather than the full clock period of the circuit of FIG. 1.

The alternating process continues for the transistors 26 and 28 to produce the third and fourth timing signals C and $\overline{D}$. When the complemented fourth timing signal $\overline{D}$ is brought to a low state it causes the NAND gate 38 to output a high signal despite the reset signal $\overline{RESET}$ being high. Then, on the next upward transition of the true clock CT the true first timing signal $\overline{A}$ is brought low. This transition then propagates through the various transistors similarly to the previous passage except for an inversion of the states. Thus, the transition must propagate around the loop twice to bring it back to its original state. This dual passage, which arises from an odd number of inversions in the loop, requires four clock cycles $4T_c$ but there are 8 different combinations of outputs during this time. The important point is that the transitions of the timing signals are separated by one-half the clock period $T_c/2$ thus providing the ability to operate with a half frequency clock oscillator.

It should be noted that the circuit of FIG. 3 is dynamic rather than static. When any of the transistors 22–28 is turned off (its clock signal being low), the input of the following inverter 30–36 is left floating. However, in MOS technology, there is sufficient capacitance on the line between the transistor and the inverter to hold the signal for a reasonable clock period. The circuit of FIG. 3 is a loop of master-master registers rather than the master-slave flip-flops of FIG. 1 having a single output per flip-flop. A typical use of the timing signals A, $\overline{B}$, C and $\overline{D}$ is to form a four-phase clock with respective four-phase clock signals PH0, PH1, PH2 and PH3. These four-phase clock signals are produced by combinational logic receiving the timing signals and performing the following logical operation; PH0=AND (A, $\overline{C}$), PH1=AND (B, $\overline{D}$); PH2=AND ($\overline{A}$, C): and PH3=AND ($\overline{B}$, $\overline{D}$). It should be noted that inverters are required if these logic operations are to be performed with AND. NAND OR or NOR gates operating upon the four produced timing signals A, $\overline{B}$, C and $\overline{D}$.

A disadvantage of this approach is that the inverters are required. An inverter necessarily has some delay in producing the inversion. If an AND gate has one inverted input and one non-inverted input then for the period of the delay there is a possibility of the wrong set of signals being presented to the AND gate. As a result. a glitch can be produced at the output of the AND gate. The problem is that the timing signals of arbitrary polarity are not fully synchronous because of the inverter delay. Some desirable timing output signals, furthermore, would require an exclusive-OR (EXOR) gate receiving the indicated signals. Exclusive-OR gates are known to produce additional glitches. Thus, the timing generator of FIG. 3 offers advantages but suffers from deficiencies.

Figure 5:
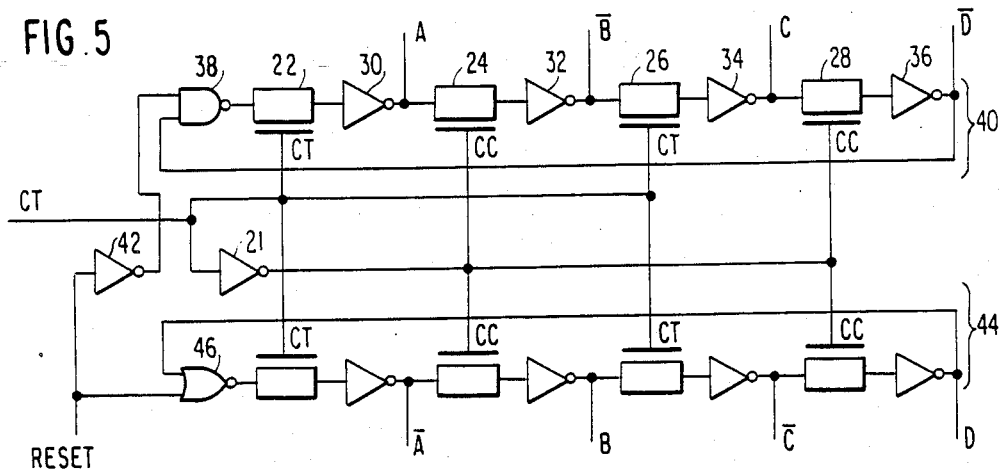
FIG. 5 is double loop embodiment of the invention.

The invention can be extended to a fully synchronous clock generator, as illustrated in FIG. 5. A first counter loop 40 is identical to the clock generator of FIG. 3 although the negative reset signal $\overline{RESET}$ is provided by a positive reset signal RESET passing through an inverter 42. A second counter loop 44 is similar to the first counter loop 40 with the following exceptions. Instead of the NAND gate 38. a NOR gate 46 receives the feedback signal and the positive reset signal RESET. That is, the second counter loop is reset on positive. The second counter loop 44 provides timing signals $\overline{A}$, B, $\overline{C}$ and D that are complementary to the corresponding timing signals of the first counter loop. Some care needs to be exercised with the reset signal, particularly to avoid the delay of the reset inverter 42 bracketing the true clock transition. If the originating reset signal is asynchronous, it should be synchronized through a chain of clocked master-slave registers driven by the clock signals CT and CC driving the counter. During the pulse to the last slave register, the reset signal should propagate through the slave gate and its associated inverter the reset inverter 42 and the AND gate 38 so that the reset signal that stabilizes in a complemented clock pulse is fully established for a following true clock pulse.

Figure 6:
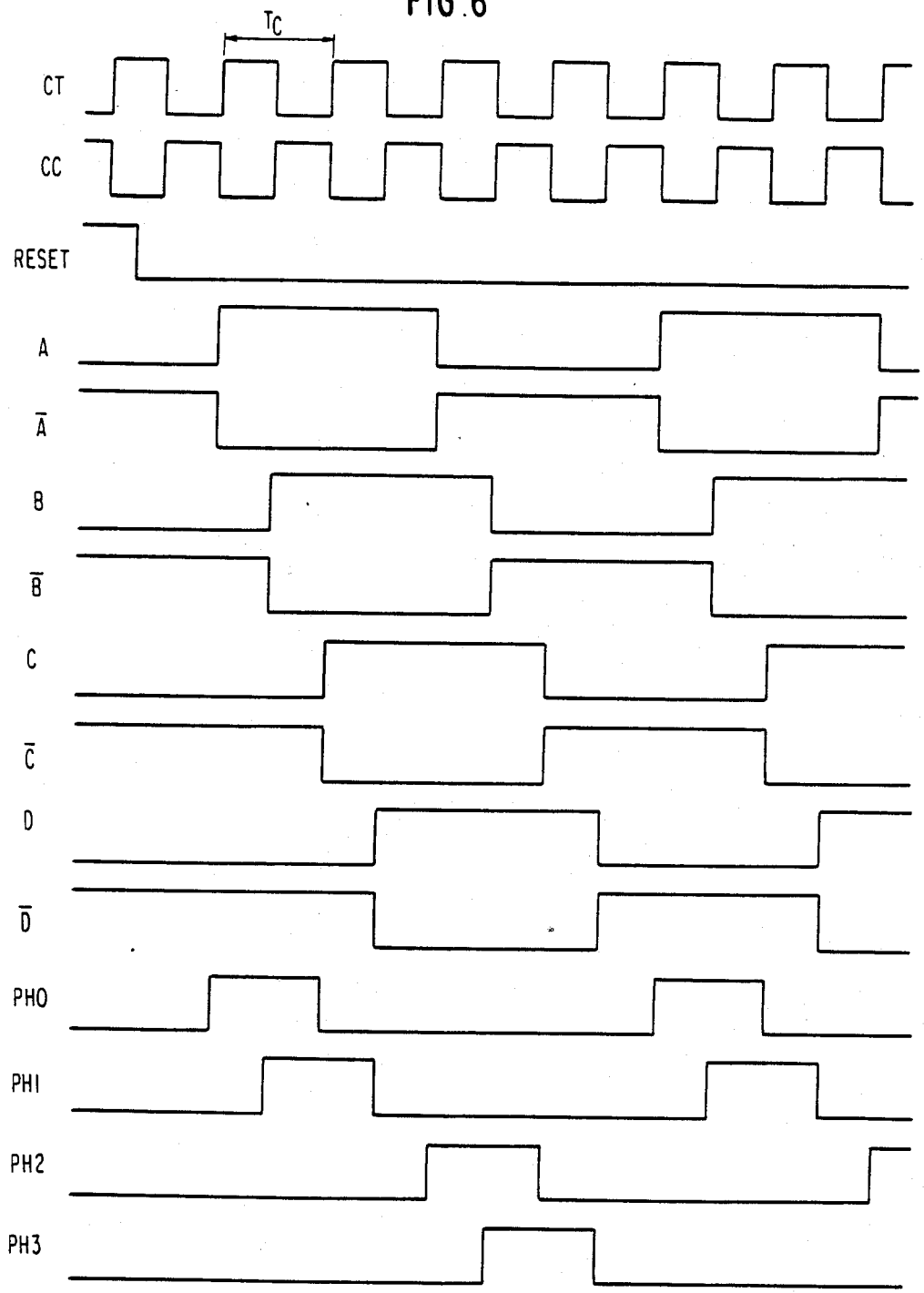
FIG. 6 is a timing diagram for the embodiment of FIG. 5.
Figure 7:
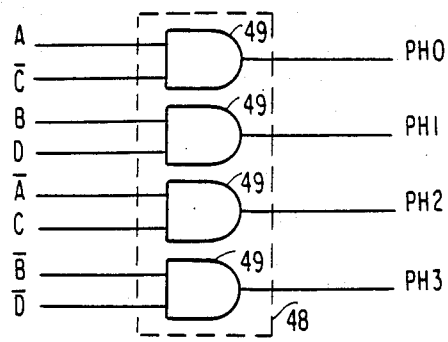
FIG. 7 is a schematic of a decoder.

The timing diagram for the clock generator of FIG. 5 is presented in FIG. 6. This timing diagram is very similar to that of FIG. 4 but includes all true and complementary versions of the timing signals. The transitions for the true and complementary versions of the same timing signal the timing signals A and $\overline{A}$ for example, occur at the same time. If there is a difference in the timing of the true and complementary timing signals the difference is related to gate skew rather than to gate delay. Gate skew is usually much less than gate delay by a factor of ten. The four-phase clock signals may also be produced from the timing signals of FIG. 5 as illustrated by a decoder 48 in FIG. 7. The decoder 48 consists of four AND gates 49 receiving different combinations of the timing signal. However, in this case the AND gates have available all the required input signals without the use of additional inverters since true and complementary values of all the timing signals are available from the clock generator. As well as the four-phase clock signal shown in FIG. 6. similar clock signals could be generated for other combinations of the timing signals. Furthermore, it is easy to use NOR gates rather than AND gates, if negative logic is used. since the negatives of the input values are immediately available.

It should be mentioned that the logical combination used to create the four-phase clock signals are chosen such that both of the inputs to be combined in a logic gate 49 result from outputs of two transistors whose gate electrodes are driven by the true clock CT or by two transistors whose gates are driven by the complemented clock CC. This choice is important since all transistors driven by the same polarity clock signal transition at the same time within the gate skew. However, it is sometimes difficult to ensure that either of the true or complementary clock signals CT and CC is absolutely square, that is, has a precise 50% duty cycle. Thus, the transitions of two timing signals respectively controlled by the true and complementary clocks CT and CC may differ by the difference of time that the clock signal is in each of its two states. The decoder 48 of FIG. 7 thus provides clock signals PH0 and PH2 that may have transitions differing by periods other than $T_c/2$ from the clock signals PH1 and PH3. Nonetheless, the inputs to the AND gates 49 are synchronized to within a gate skew. It is again mentioned that AND gates are typically not fabricated as such. Instead, NOR or NAND gates can be used since true and complemented timing signals are available.

Figure 8:
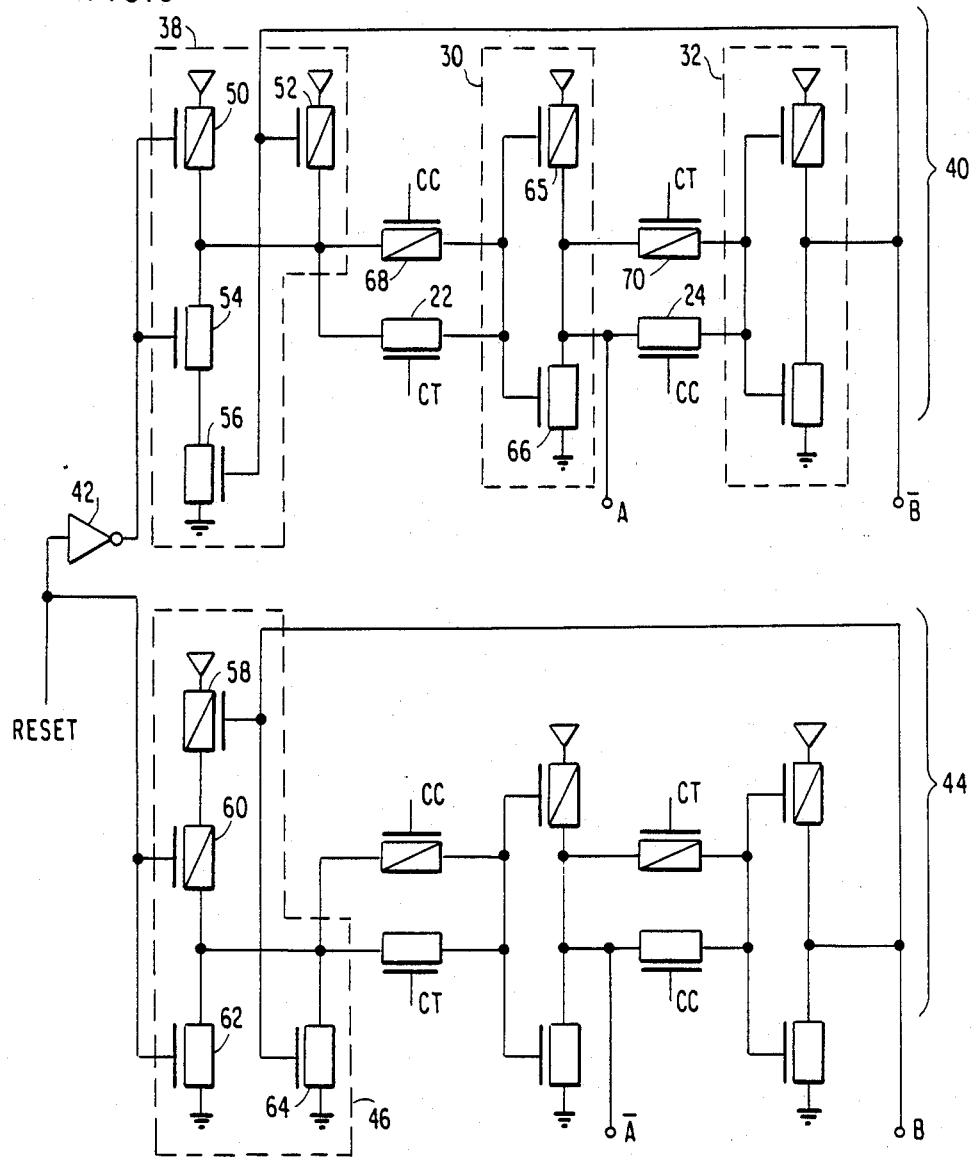
FIG. 8 is a CMOS embodiment of the invention.

A transistor level implementation of the clock generator of FIG. 5, although restricted to a two-stage clock, is shown in FIG. 8 for CMOS technology. The NAND gate 38 is implemented by two PMOS transistors 50 and 52 and two NMOS transistors 54 and 56. The NOR gate 46 is likewise implemented with two PMOS transistors 58 and 60 and two NMOS transistors 62 and 64, although in a different configuration. The inverter 30, for example, has a series connection of a PMOS transistor 65 connected to the positive power supply and a NMOS transistor 66 connected to ground. Their coupling point is the output of the inverter 30 and provides the timing signal A. The gate electrodes of both of the transistors 65 and 66 are controlled by the input to the inverter 30. The NMOS transistors 22 and 24 in the first clock loop 40, as well as corresponding NMOS transistors in the second clock loop 44, are similarly connected as corresponding transistors in FIG. 5 and provide the same function. It is recommended, however, to provide PMOS transistor 68 and 70 in parallel with the NMOS transistors 22 and 24 and control them with the complement of the clock signal controlling the NMOS transistors 22 and 24 respectively. These parallel transistors provide increased speed and both phases of the clock signal are available. Furthermore, the parallel transistors provide better voltage swings. A MOS gate has a threshold voltage of approximately 1½ volts. Hence, an N-type gate has transitions between 0 and 3.5 V while a P-type gate has transitions between 1.5 and 5 V. The impedances are such that parallel N-type and P-type gates have transitions between 0 and 5 volts.

Although the invention has been described in terms of a clock generator, it can alternatively be used as an event counter or as a pulse program generator. In an event counter, the clock signal is replaced by a signal indicating the occurrence of an event. In a pulse program generator, the decoder has more complex logic that produces parallel sequences of timing or control signals, e.g. for direct control of interacting elements.

What is claimed is:

1. A fully synchronized clock generator comprising:
   first and second synchronous counters, each comprising:
   a string of at least two serially connected shifting elements, said string having a string input terminal and a string output terminal, each of said shifting elements comprising a series connection of an inverter and a transistor having two current-carrying electrodes and a control electrode;
   control means having an output connected to said string input terminal, a first input terminal connected to said string output terminal, and a second input terminal connected for receiving a reset signal for placing said control means into one of two modes so that each of said first and second counters are synchronously reset with respect to one another, said control means resetting said counter in a first mode, and operating as an inverter in a second mode; and
   clock means for applying voltages of a given phase to the control electrode of the transistor of the first and any subsequent odd-numbered shifting element in said string, and for applying voltages of an opposite phase to the control electrode of the transistor of the second and any subsequent even-numbered shifting element in said string;
   wherein said control means of said first counter and said control means of said second counter are of different constructions such that said first and second counters can be reset to, and operate in, polarities opposite to one another.

2. A clock generator as claimed in claim 1, further comprising
   a respective output terminal connected to each of said shifting elements.

3. A clock generator as claimed in claim 1, wherein said control means of said first counter is a NAND gate, and said control means of said second counter is a NOR gate.

4. A clock generator as claimed in claim 1, further comprising
   reset means for applying a reset signal to the second input terminal of said first counter control means, and for applying an inverted reset signal to the second input terminal of said second counter control means.

5. A fully synchronized clock generator comprising:
   first and second synchronous counters, each comprising:
   shifting means comprising a series connection of:
   at least first and second field-effect transistors each having input and output current-carrying electrodes and a control electrode, the input current-carrying electrode of the first field effect transistor in said shifting means representing a shifting means input terminal; and
   an inverter having an input, connected to said output electrode, and an output, the output of the last inverter in said shifting means representing a shifting means output terminal;
   each counter further comprising control means having an output connected to said shifting means input terminal, a first input terminal connected to said shifting means output terminal, and a second input terminal connected for receiving a reset signal for placing said control means into one of two modes so that each of said first and second counters are synchronously reset with respect to one another, said control means resetting said counter in a first mode, and operating as an inverter in a second mode;
   clock means for applying voltages of a given phase to the control electrode of said first and any subsequent odd-numbered transistor in said shifting means, and for applying voltages of an opposite phase to the control electrode of said second and any subsequent even-numbered transistor in said shifting means;
   wherein said control means of said first counter and said control means of said second counter are of different constructions such that said first and second counters can be reset to, and operate in, polarities opposite to one another.

6. A clock generator as claimed in claim 5, further comprising a decoding circuit having inputs connected to the output terminals of said inverter.

7. A clock generator as set forth in claim 5, wherein each of said inverters includes an N channel device and a P channel device.

* * * * *